US009538667B2

(12) United States Patent
Frank et al.

(10) Patent No.: US 9,538,667 B2
(45) Date of Patent: Jan. 3, 2017

(54) ELECTRICAL COMPONENT FOR SURFACE MOUNTING

(75) Inventors: Oliver Frank, Hemsbach (DE); Jochen Fertig, Bensheim (DE); Lutz Neubert, Mannheim (DE); Thomas Schmitt, Moerfelden-Walldorf (DE); Willi Dietrich, Ober-Ramstadt (DE); Michael Spielvogel, Bad Durkheim (DE); Ulrich Kiefner, Duerrwangen (DE); Sebastian David, Eppelheim (DE)

(73) Assignee: TE Connectivity Germany GmbH, Bensheim (DE)

( * ) Notice: Subject to any disclaimer, the term of this patent is extended or adjusted under 35 U.S.C. 154(b) by 234 days.

(21) Appl. No.: 13/883,559

(22) PCT Filed: Oct. 31, 2011

(86) PCT No.: PCT/EP2011/069096
§ 371 (c)(1),
(2), (4) Date: May 3, 2013

(87) PCT Pub. No.: WO2012/059451
PCT Pub. Date: May 10, 2012

(65) Prior Publication Data
US 2013/0223039 A1   Aug. 29, 2013

(30) Foreign Application Priority Data
Nov. 5, 2010 (DE) .................. 10 2010 043 495

(51) Int. Cl.
*H05K 3/34* (2006.01)
*H01R 12/57* (2011.01)
(Continued)

(52) U.S. Cl.
CPC ............ *H05K 3/3447* (2013.01); *H01R 12/57* (2013.01); *H01R 12/707* (2013.01);
(Continued)

(58) Field of Classification Search
CPC ................. H05K 5/02; H05K 3/3447
(Continued)

(56) References Cited

U.S. PATENT DOCUMENTS 4,721,472 A   1/1988   Gentry et al.
5,213,515 A   5/1993   Ishikawa et al.
(Continued)

FOREIGN PATENT DOCUMENTS

GB   2285346 A   7/1995
JP   H 3226979 A   10/1991
(Continued)

OTHER PUBLICATIONS

International Search Report and Written Opinion issued by the European Patent Office, dated Jan. 17, 2012, for related International Application No. PCT/EP2011/069096; 13 pages.
(Continued)

*Primary Examiner* — Adrian S Wilson
(74) *Attorney, Agent, or Firm* — Faegre Baker Daniels LLP

(57) ABSTRACT

The present invention relates to an electrical component, in particular for surface mounting, comprising a housing body, preferably configured as a housing block, comprising a plurality of contact pins which project from the housing body, at least in portions, and comprising at least one orientation element on which, at least in the operating position thereof, the contact pins rest orientated along a predetermined contact contour (K), at least in portions. According to the invention, by installing the at least one orientation element with spacing from the housing body a component can be provided which is simple and cost-effective to produce, versatile and can be fitted in a reliable manner.

32 Claims, 8 Drawing Sheets

(51) Int. Cl.
*H01R 12/70* (2011.01)
*H01R 12/71* (2011.01)
*H01R 13/506* (2006.01)
*H05K 5/02* (2006.01)

(52) U.S. Cl.
CPC ......... *H01R 12/714* (2013.01); *H01R 13/506* (2013.01); *H05K 5/0247* (2013.01)

(58) Field of Classification Search
USPC .. 361/807, 809, 810, 760, 772, 775; 439/79, 372
See application file for complete search history.

(56) References Cited

U.S. PATENT DOCUMENTS

| | | | | |
|---|---|---|---|---|
| 5,256,072 A | * | 10/1993 | Hatagishi | H01R 12/716 439/142 |
| 5,346,404 A | | 9/1994 | Shimada | |
| 5,613,882 A | * | 3/1997 | Hnatuck | H01R 13/506 439/372 |
| 5,679,009 A | | 10/1997 | Okumura et al. | |
| 5,692,912 A | * | 12/1997 | Nelson | H01R 12/724 439/79 |
| 5,827,076 A | * | 10/1998 | Chen | H01R 12/7005 439/590 |
| 5,906,518 A | * | 5/1999 | Sun | 439/660 |
| 5,921,789 A | * | 7/1999 | Makino | H01R 12/716 439/590 |
| 6,012,930 A | | 1/2000 | Tokuwa et al. | |
| 6,093,033 A | | 7/2000 | Kuki et al. | |
| 6,126,470 A | * | 10/2000 | Ono | H01R 13/62972 439/310 |
| 6,171,116 B1 | * | 1/2001 | Wicks | H01R 12/724 439/79 |
| 6,494,724 B1 | * | 12/2002 | Bixler | H01R 13/506 439/79 |
| 6,554,642 B1 | * | 4/2003 | Xiang | H01R 12/724 439/567 |
| 6,736,650 B1 | * | 5/2004 | Chen | H01R 13/4368 439/713 |
| 7,175,447 B2 | * | 2/2007 | Pan | H01R 12/727 439/79 |
| 7,303,431 B2 | * | 12/2007 | Lin | H01R 12/7076 439/372 |
| 7,331,801 B1 | * | 2/2008 | Eichorn | H01R 12/724 439/76.1 |
| 7,428,156 B2 | * | 9/2008 | Knappich et al. | 361/810 |
| 8,070,529 B2 | * | 12/2011 | Xiong | H01R 12/725 439/620.15 |
| 8,277,262 B2 | | 10/2012 | Busse | |
| 2009/0170367 A1 | * | 7/2009 | Hemmi | H01R 12/88 439/372 |

FOREIGN PATENT DOCUMENTS

WO    WO 2006093921 A1 *   9/2006
WO    WO 2009/052965 A2    4/2009

OTHER PUBLICATIONS

Examination Report issued by the German Patent and Trademark Office, dated Jun. 27, 2011, for German priority Application No. 10 2010 043 495.7; 5 pages.

* cited by examiner

ELECTRICAL COMPONENT FOR SURFACE MOUNTING

The present invention relates to an electrical component, in particular a component for surface mounting, comprising a housing body, preferably configured as a housing block, comprising a plurality of contact pins which project from the housing body, at least in portions, and comprising at least one orientation element on which, at least in the operating position thereof, the contact pins rest orientated along a predetermined contact contour, at least in portions.

The electrical component may for example be a connector, a plug connector, a microchip, a capacitor or another component which comprises at least two contact pins and can be connected to a carrier, preferably a contact carrier, and soldered, for example via the contact pins thereof, to the contact surfaces of said carrier.

The contact pins are for example mounted on the housing body of the electrical component, the contact pins being shaped from an elongated shape into a bent contact shape before or after mounting. In this case, the contact pins must be orientated along the contact contour. However, tolerances during mounting and deformation mean that the contact pins are not arranged entirely precisely along the contact contour, and deviate more or less from their target position relative to the contact contour. A deviation of this type may result in insufficiently contacted contact pins in a fitting process in which an electrical component is to be mounted on the contact carrier.

Electrical components are known which have what are known as J-lead or gull-wing contact pins, which are formed so as to be substantially C-shaped or Z-shaped. Components equipped with contact pins of this type can be fitted and soldered particularly easily as so-called surface-mounted components (surface-mounted devices, SMDs).

A problem with bent contact pins such as J-lead contact pins is that they are usually made of metal and thus have resilient properties, as a result of which the contact pins may still deform resiliently in different ways after shaping. In order to orientate the contact pins in a predetermined contact contour, components having housing bodies provided with orientation regions which orientate the contact pins in the desired contact contour are known from the prior art, for example from WO 2006/093921 A1 and WO 2006/091961 A1.

U.S. Pat. No. 5,133,670, U.S. Pat. No. 5,354,207 and U.S. Pat. No. 6,065,978 also disclose surface-mounted components which comprise an orientation element arranged directly in or immediately on the housing body.

Standard housings cannot be used in the case of the known electrical components comprising orientation elements which are formed or arranged on the housing body, since the housing must be specially adapted for the arrangement of the orientation element. As a result, the known electrical components cannot be used in a flexible manner, since the arrangement of the orientation element is already predetermined by the configuration of the housing body.

The object of the present invention is therefore to provide an electrical component which ensures that the contact pins are orientated in a predetermined contact contour and the component can thus be fitted in a reliable manner. At the same time the electrical component must be simple and cost-effective to produce and usable in a flexible manner.

This object is achieved for the electrical component mentioned at the outset by installing the at least one orientation element with spacing from the housing body.

Because the orientation element is installed with spacing from the housing body, no modifications to the housing body itself are required, in such a way that standard housing bodies of electrical components can be used without constructional modifications being necessary with regard to the installation of the orientation element. Since in the case of the electrical component of the present invention there is no limitation, with respect to the installation of the orientation element, to modifications to the housing body or spatial restrictions which are predetermined by the construction of the housing body, it is possible to use orientation elements configured in virtually any way which can be produced with a high level of precision and thus allow extremely precise orientation of the contact pins in the predetermined contact contour.

In the component of the present invention, the free ends of the contact pins, which ends project from the housing body, can therefore be orientated very precisely along the contact contour. In this case, the contact contour emulates the region of the contact carrier on which the contact portions of the electrical component are connected, for example soldered, to the contact surface of a contact carrier. The surface of the contact carrier is often planar, for example in the case of a circuit board, in such a way that the contact contour corresponds to a contact plane in which the contact portions of the contact pins, which contact portions are to be connected to the circuit board, are orientated in a coplanar manner. Contact pins which are orientated as precisely as possible along the contact contour ensure good fitting of the electronic component, since this ensures abutment with the counter contacts of the contact carrier in such a way that the contact pins can reliably be soldered to the counter contacts.

The solution according to the invention can be improved further by means of various configurations which are each advantageous per se and can be combined with one another as desired. These embodiments and the advantages respectively associated therewith are discussed in the following, the constructional measures and the effects thereof being described merely by way of example.

In a first embodiment, the at least one orientation element can be installed on at least one arm projecting from the housing body. The arm can be a separate element which is fastened to the housing body. Alternatively, the arm can be formed directly on the housing body or can be installed or formed on an element arranged on the housing body, for example a fastening means. An arm of this type makes it possible in a simple manner, irrespective of the design of the housing body, to install the orientation element with spacing from the housing body.

In a further embodiment, at least two arms may be provided which are bridged by the orientation element. In this way, each of the two longitudinal ends of the orientation element, for example an orientation plate, an orientation rod, an orientation shaft or an orientation rib, can be installed on an arm and the orientation element thus mounted between the two arms.

Installing the orientation element on the arm also makes it possible to provide the electrical component with two or more orientation elements. Thus, for example, two orientation elements can be installed on the same arm or the same two arms. As a result, the contact pins projecting from one side or from different sides of the component housing are divided into two groups, one of which is assigned to one of the two orientation elements in each case. In this way the contact pins of the two groups can be orientated in a respective contact contour which is predetermined by the corresponding orientation element. The two contact contours may for example be orientated so as to be coplanar with one another.

Alternatively or additionally, a further orientation element may be installed on another side of the component housing on one arm or on the same arms. In this way the contact pins of a component, which has a plurality of sides provided with contact pins, can be orientated.

In a further configuration a side plate which is installed on the housing body can form at least one arm. A side plate of this type can be styled independently of the housing body and thus in a flexible manner in any desired form and subsequently fastened, for example adhesively bonded or clipped, to the housing. In principle, any desired positive, non-positive or cohesive connection is possible. In order to arrange orientation elements on different sides of the housing body, at least two arms may be provided which project on different sides of the housing body, for example a plate, such as a solder clip or solder plate, which projects on both sides beyond the edge of the housing body, can be fastened to a side wall of the housing body, in such a way that the two regions projecting beyond the housing body each form an arm on opposite sides of the housing body.

During production there is great freedom of design regarding the orientation and shaping of the arm, which can thus project at virtually any desired point on the housing body and offers great flexibility in terms of the possibilities regarding how the orientation element is orientated relative to the housing body when installed and in relation to the number of orientation elements to be installed.

In a further configuration, the components may comprise at least one fastening means for mounting the component on a carrier, preferably on a contact carrier, the at least one orientation element being installed on the at least one fastening means. The at least one fastening means may preferably form the at least one plate. The fastening means of the electrical component are preferably a separate element, for example in the form of a solder plate or solder clip which is fastened to the housing body. The fastening means comprise mounting regions which can be connected to the contact carrier, for example mounting faces which can be soldered to the contact carrier. By installing the at least one orientation element on the fastening means, for example a solder plate or solder clip, which in the case of a plurality of electrical components is used anyway for mounting the component on the contact carrier, a flexible and versatile electrical component comprising an orientation element for orientating the contact pins in a predetermined contact contour can be provided by modifying the fastening means. Fastening means of this type, for example solder plates or solder clips, which are usually produced as stamped parts, can easily be produced so as to comprise an arm.

To stabilise the arm, in particular an arm formed on the fastening means, the fastening means may comprise mounting regions which can be connected to the contact carrier, the arm comprising at least one of the mounting regions. If a solder clip or a solder plate is used as a fastening means, this generally comprises a fastening portion in the form of a soldering face which is soldered to the surface of the contact carrier. This fastening region is usually located on the housing body. In order also to connect the arm(s) projecting from the housing body to the contact carrier, the arm may comprise a further mounting region, for example a further fastening face, which is orientated so as to be coplanar with the fastening face arranged on the housing body.

In a further embodiment, the at least one arm may comprise a retainer for installing the orientation element. The retainer may for example be formed from a projection projecting from the arm, with which projection a region of the orientation element is brought into engagement. For example, a projection of this type may be configured in the form of a hook into which the orientation element is hooked. Alternatively, the retainer could be formed as a closed sleeve or a sleeve which is open on one side, into which a portion of the orientation element can be inserted.

In a further embodiment, the at least one orientation element can be configured such that it can be transferred from a mounting position, in which it can be installed on the retainer, into the operating position, in which it is fastened to the retainer. This embodiment facilitates the assembly of the component and ensures that the orientation element is properly fastened to the retainer, since it is initially arranged in the mounting position on the retainer before it is brought into the operating position. At least in the operating position, the orientation element rests against the contact pins and orientates them in the contact contour. The at least one orientation element may preferably be configured such that it can be rotated from the mounting position into the operating position, as a result of which the transfer is made possible in a simple and space-saving manner.

In a further embodiment, a preferably continuous recess of the arm can form the retainer. The configuration of the retainer as a recess of the arm is constructionally particularly simple, since the arm is preferably formed as a stamped element, for example as a solder plate. The recess may for example be an end groove or a slot which ends in an edge region of the arm, into which the orientation element can be inserted. A possibility for holding the orientation element in the recess is to exploit the bias of the resilient contact pins in order to press the orientation element into the recess.

In one embodiment, the recess can be configured as a through-hole. A through-hole can be produced in the arm in a simple manner without lessening the stability thereof. The orientation element may be configured such that it can be inserted through the through-hole, as a result of which a reliable retainer for the orientation element can be produced in a constructionally simple manner. By styling the outline of the through-hole in a corresponding manner, for example in such a way that the outline of the through-hole is adapted to the insertion profile of the orientation element, viewed in the insertion direction along the orientation element, an orientation element configured in virtually any desired manner can be held in the through-hole. By way of a through-hole which is adapted to the insertion profile of the orientation element, it can also be provided that the orientation element can only be inserted through the through-hole and brought into the mounting position in a predetermined orientation.

In order to prevent the orientation element from being removed or released from the fastening means unintentionally, according to a further embodiment a securing means may be provided which secures the orientation element against removal from the fastening means during transfer from the mounting position into the operating position. In this way the orientation element is held captively during the transfer. The securing means can be arranged on the fastening means and/or on the orientation element or can be a separate part which prevents the orientation element arranged on the component from being removed without releasing the securing mechanism. Possible securing means are for example a split pin, a bolt, a catch mechanism or a screw fitting.

In a further embodiment, a securing projection can be formed as a securing means on the orientation element.

Arranging the securing means on the orientation element has the advantage that it can thus be ensured that the securing means can only be transferred into the operating position, in which the orientation means is secured against removal from the component, when the orientation element is installed in the desired mounting position on the component. A securing projection can be produced on the orientation element in a simple manner. A securing projection can also be brought into abutment with a face of the fastening means or into engagement with a specific region of the fastening means by rotating the orientation element relative to the fastening means and is thus well adapted for embodiments in which the orientation element is configured to be rotatable.

In a further embodiment, the electrical component may comprise a locking element for fixing the orientation element in the operating position. By way of a locking means it can be ensured that the orientation element is rigidly connected to the fastening means, for example an arm of the fastening means, and thus fixed in the desired operating position. In one embodiment the locking element can simultaneously also be the securing means. However, it is also possible to provide a separate securing means and a separate locking element, the securing means firstly ensuring that the orientation element is held captively on the component, while the locking element then ensures that the orientation element is fixed in the operating position. Any desired positive, non-positive or cohesive locking elements may be used, for example keys, screw connections, mortise joints or press connections. In the case of a positive connection, it is possible to fix the orientation element to the component and release it therefrom repeatedly. This can be achieved for example in that the locking element is formed as a catch means which for example is arranged on the arm and the orientation element comprises a counter catch which can be latched to the catch means. A positive catch mechanism of this type, which is formed by the catch means of the arm and the corresponding counter catch of the orientation element, can be produced in a constructionally simple manner and reliably ensures that the orientation element is secured in the operating position.

In a further embodiment, the counter catch may be arranged on the securing projection. In this way, the locking element is arranged on the securing means. It can thus be provided that, as soon as the orientation element is transferred into the operating position, for example by rotating the orientation element relative to the fastening means, the securing means is latched and the orientation element is thus fixed.

The invention is explained below by way of example by means of embodiments, with reference to the drawings. The different features of the embodiments may be combined independently of one another, as set out previously for the individual advantageous configurations.

The individual components, and the functions thereof, of an electrical component 1 according to the invention for surface mounting on a contact carrier 14 of a first embodiment will firstly be described with reference to the exploded view of FIG. 1 and with regard to FIG. 2 to 5.

Figure 1:
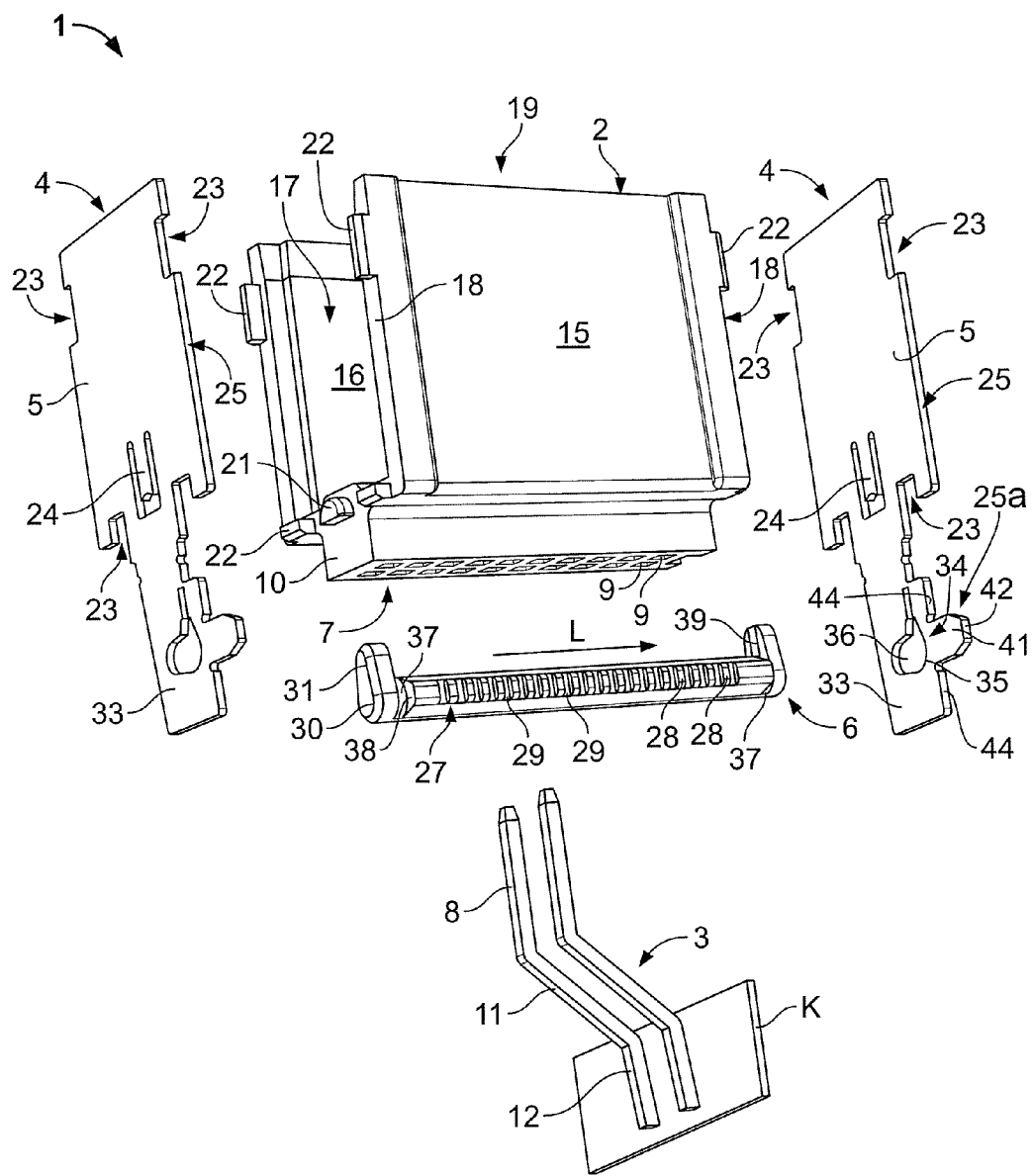
FIG. 1 is a perspective exploded view of an electrical component according to the invention, in a first embodiment.

FIG. 1 is an exploded view of the electrical component 1—a plug connector in the embodiment shown—the electrical component comprising a housing body 2, a plurality of contact pins 3, two fastening means 4, solder clips 5 in the embodiment shown and an orientation element 6. In the first embodiment of FIG. 1 to 5, the electrical component 1 has contact pins 3 only on one contact side 7. The contact pins 3 can be connected rigidly to the housing body 2 of the electrical component 1. For this purpose the fastening portions 8 of the contact pins 3 are pressed into fastening openings 9 of a fastening grid 10 located on the contact side 7 of the housing body 2. The contact pins 3 fastened in the fastening openings 9 project from the housing body 1 on the contact side 7.

A spacer portion 11 which extends at an angle to the fastening portion 8 is connected to the end of the fastening portion 8 which faces away from the housing body 2. The contact portion 12 of the contact pins 3, which contact portion extends at an angle to the spacer portion 11 and substantially parallel to the fastening portion 8, is connected to the end of the spacer portion 11 which faces away from the fastening portion 8. In the embodiment shown, a plurality of contact pins 3 are arranged in the fastening grid 10, which is formed by two parallel rows of fastening openings 9, in such a way that the contact portions of said contact pins are orientated roughly along a contact contour K—in the embodiment shown, a contact area K. The contact pins 3 are formed as what are known as SMD contacts, which can be fastened to contact surfaces 13 of a contact carrier 14, for example to planar solder contacts of a circuit board.

In addition to the fastening grid 10, the housing body 2 comprises a lower face 15 and an upper face 16 which extend substantially parallel to one another and define a housing interior 17 into which a plug (not shown) can be inserted along an insertion direction E into the electrical component 1, configured as a plug connector, according to the embodiment shown in FIG. 1 to 5.

The component is placed on a carrier 14a, for example the contact carrier 14, in a mounting direction M and mounted thereon. When the electrical component 1 is mounted on the carrier 14a or the contact carrier 14, as shown in FIG. 5 and FIG. 6, the lower face 15 of the housing body 2 is assigned to the fastening surface 13a or the contact surface 13 of the contact carrier 14.

Figure 5:
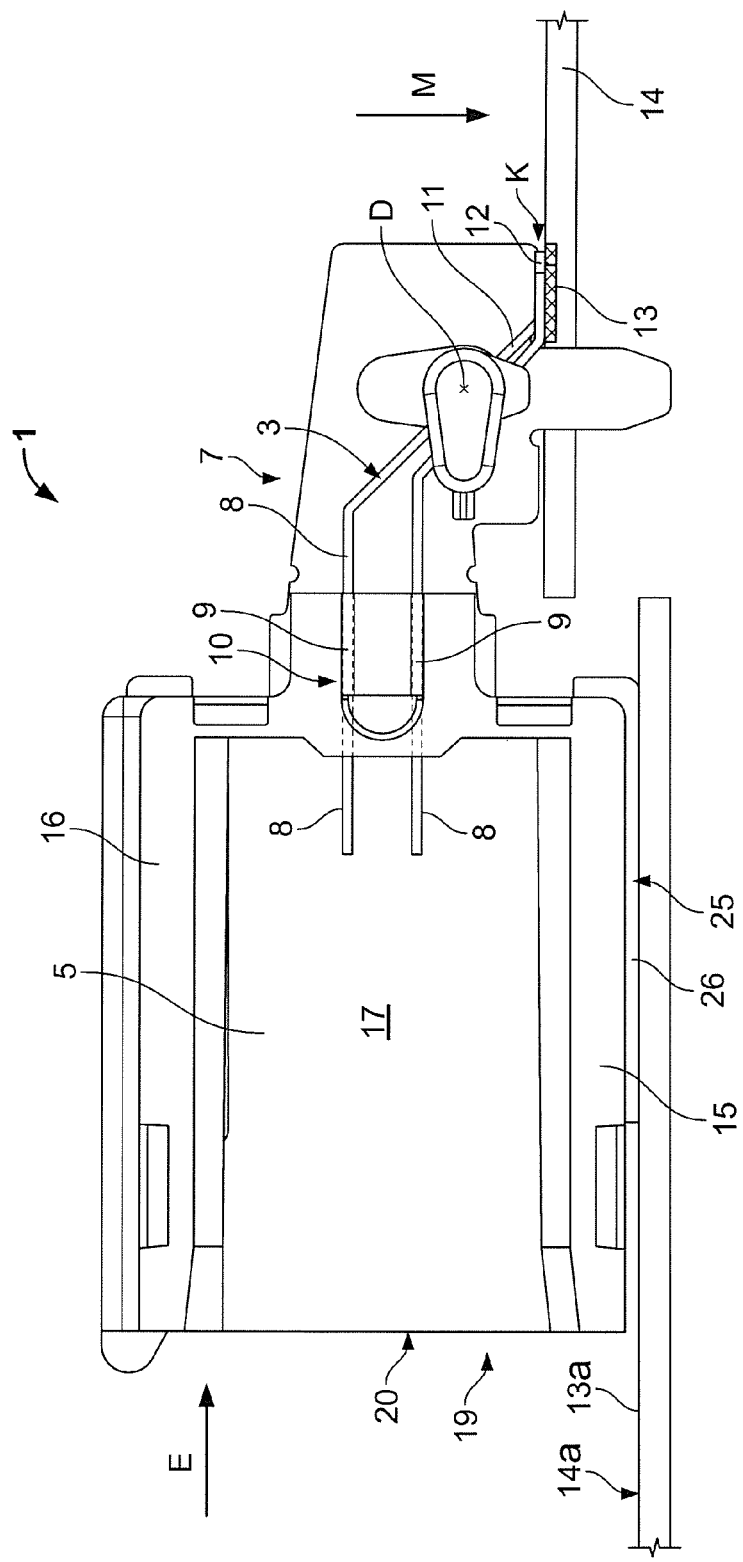
FIG. 5 is a side view of the component according to the invention, of the first embodiment, which component is mounted on a carrier.
Figure 6:
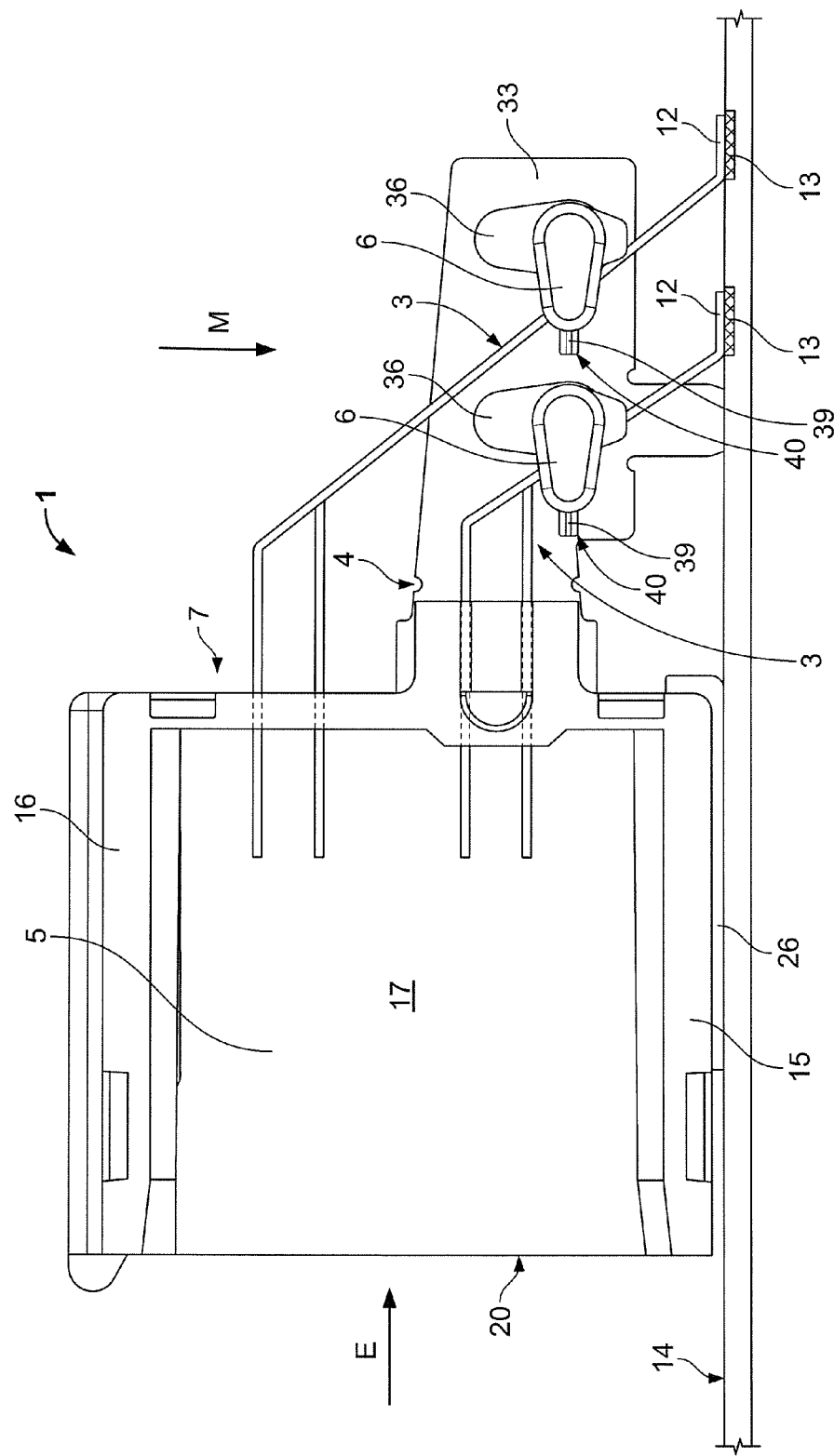
FIG. 6 is a side view of an electrical component according to a further embodiment, mounted on a contact carrier.

As is clear from the side view of FIG. 5, but also from FIG. 1, the housing body 2 of the embodiment shown has a substantially U-shaped cross-section, in other words the housing body 2 is open on the sides 18 arranged perpendicular to the insertion direction E and to the mounting direction M.

In the embodiment of the electrical component shown, these open sides 18 are closed by plates 5 serving as fastening means 4. The plates 5, preferably solder plates, are substantially rectangular and correspond to the rectangle spanned by the U-shaped side faces 18 of the housing body 2. The solder plates 5 are latched to the side faces 18 of the housing body 2 and thus fastened in such a way that they close the housing body 2 laterally. A plug connector is thus formed as an electrical component 1, on the connection side 19 on which, opposite the contact side 7, a connection opening 20 is provided for inserting the plug connector (not shown) into the interior 17 of the electrical component 1. For latching the solder plates 5 to the side faces 18 of the housing body 2, the housing body 2 comprises a catch projection 21 which projects from the side face 18 thereof in the region of the fastening grid 10. The upper face 16 and lower face 15 and the fastening grid 10 are also provided on their side faces 18 with laterally projecting fastening projections 22 which project from the side faces 18 as rectangular tongues.

The solder plates 5, which are generally formed as stamped parts, comprise fastening openings 23 corresponding to the fastening projections 22. When the solder plates 5 are mounted, the fastening projections 22 are positioned in the fastening openings 23, which prevents the solder plate 5 from being displaced along the side face 18 of the housing body 2.

In the region assigned to the catch projection 21, the plate 5 comprises a catch tongue 24 which latches to the catch projection 21 in a resiliently deflectable manner when the solder plates 5 are placed on the side face 18 of the housing body 2. The catch mechanism 21, 24 formed of the catch projection 21 and the catch tongue 24 prevents the solder plates 5 from being removed from the side faces 18 of the housing body 2.

Figure 2:
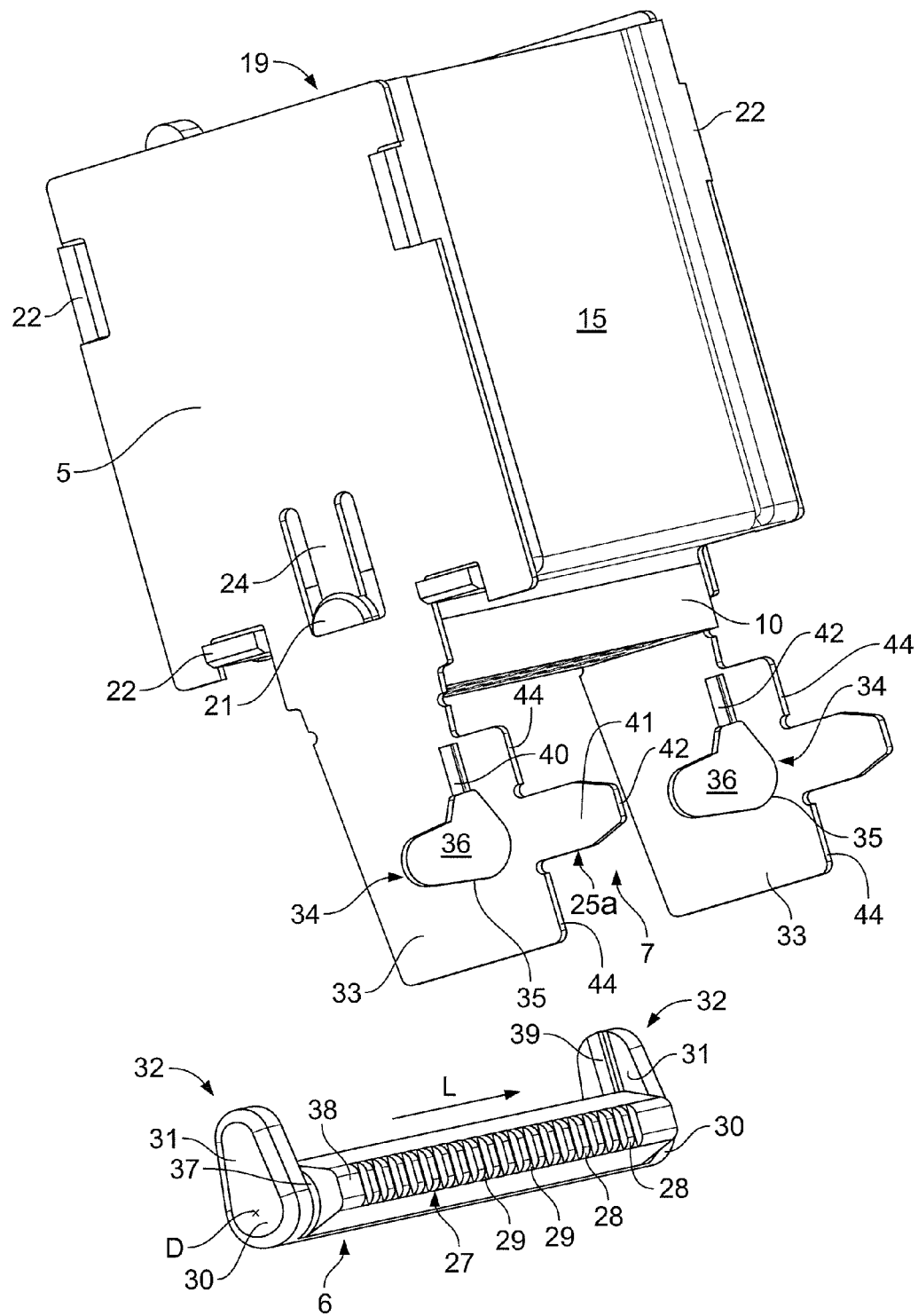
FIG. 2 is a perspective view of the electrical component according to the invention, of FIG. 1 without contact pins and before the orientation element is installed.

The component 1 comprising plates 5 fastened to the side faces 18 is shown in FIG. 2, from which it is clear how the fastening projections 23 are arranged in the associated fastening openings 23 and the catch tongue 24 is latched to the catch projection 21.

Figure 4:
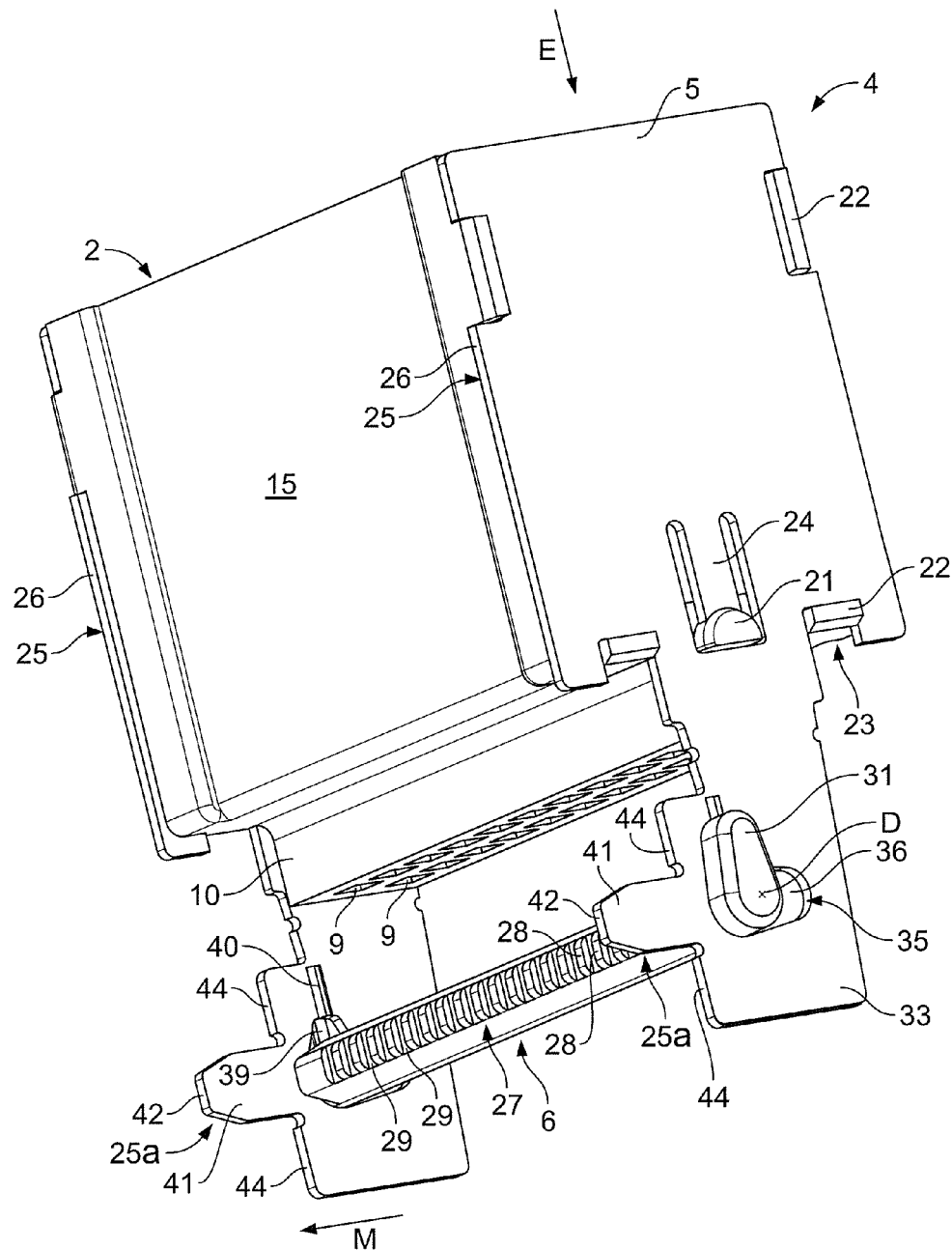
FIG. 4 is a schematic perspective view of the electrical component of the first embodiment, in which the orientation element is installed in the operating position.

The fastening means 4, the solder plates 5 in the embodiment shown, comprise mounting regions 25. With reference to FIGS. 4 and 5, the mounting regions 25 project beyond the lower face 15 of the housing body 2 and thus form mounting rails 26 with which the electrical component 1 can be mounted, for example adhesively bonded or soldered, on the carrier 14a or the contact carrier 14 once the component has been properly placed on the contact carrier 13 in the mounting direction M.

An embodiment of the electrical component comprising an orientation element 6 installed on the fastening means 4 will be described in further detail below, in particular with reference to FIGS. 1 and 2.

The orientation element 6 of the embodiment shown is substantially rod-shaped with an oval cross-section which has the shape of a camshaft or an eccentric. The orientation element is provided along its longitudinal direction L with an orientation comb 27 which comprises a plurality of teeth 28 arranged side by side in the longitudinal direction L and represents the cam or the eccentric part of the orientation rod 6 or the orientation shaft. The valleys 29 located between the teeth serve as receptacles and stops for the contact pins 3 and, in the operating position which is shown in FIGS. 4 and 5, firstly prevent the contact pins 3 from being displaced in or counter to the longitudinal direction L and thus prevent adjacent contact pins 3 from touching one another. In addition, in the embodiment shown the contact pins 3 rest with their spacer portions 11 in the operating position against the valleys 29 of the orientation comb 27 of the orientation element 6, in such a way that the contact portions 12 of the contact pins 3 are orientated in the predetermined contact contour K by the orientation element 6. When the orientation element 6 is installed on the fastening means 4 of the electrical component 1 in the operating position (see FIG. 5), the fastening comb 27 faces in the mounting direction M of the housing body 2. When the electrical component 1 is mounted on the contact carrier 14 (see FIG. 5), the orientation comb 27 thus faces in the direction of the contact surface 13 of the contact carrier 14.

On the ends 30 facing in and counter to the longitudinal direction L, the orientation element 6 is equipped in each case with a securing projection 31. As explained in greater detail below, the securing projection 31 forms a securing means 32 which secures the orientation element 6 against removal from the component, in the embodiment shown against removal from the fastening means 4. As can best be seen in FIG. 3, the profile of the orientation element 6, viewed in the longitudinal direction L, is substantially L-shaped, the wing- or oval-shaped securing projection 31, viewed in the insertion profile, in other words in the longitudinal direction L, and the eccentric comb 27 of the rod-shaped orientation element 6 forming limbs which are substantially perpendicular to one another. In the case of the insertion profile of the embodiment shown, the limb formed by the securing projection 31 is the longer of the two limbs compared with the limb formed by the orientation comb 27.

The mounting and installation of the orientation element 6 on the fastening means 4 will be described in greater detail below with particular reference to FIG. 2 to 4.

In the electrical component 1 according to the invention, according to the embodiment shown in the figures, the orientation element 6 is installed on an arm 33 which projects from the housing body 2 on the contact side 7 in the insertion direction. In the embodiment shown, the arm 33 is formed on the fastening means 4. The fastening means 4 is formed as a stamped part, the arm 33 being directly connected to the plate 5 which forms the side cover of the housing body 2.

The arm 33 comprises a retainer 34 for installing the orientation element 6. In the embodiment shown, the retainer 34 is formed by a continuous recess 35 in the form of a through-hole 36. The through-hole 36 is large enough that the orientation element 6 can be inserted, along its longitudinal direction L, through the through-hole 36.

Figure 3:
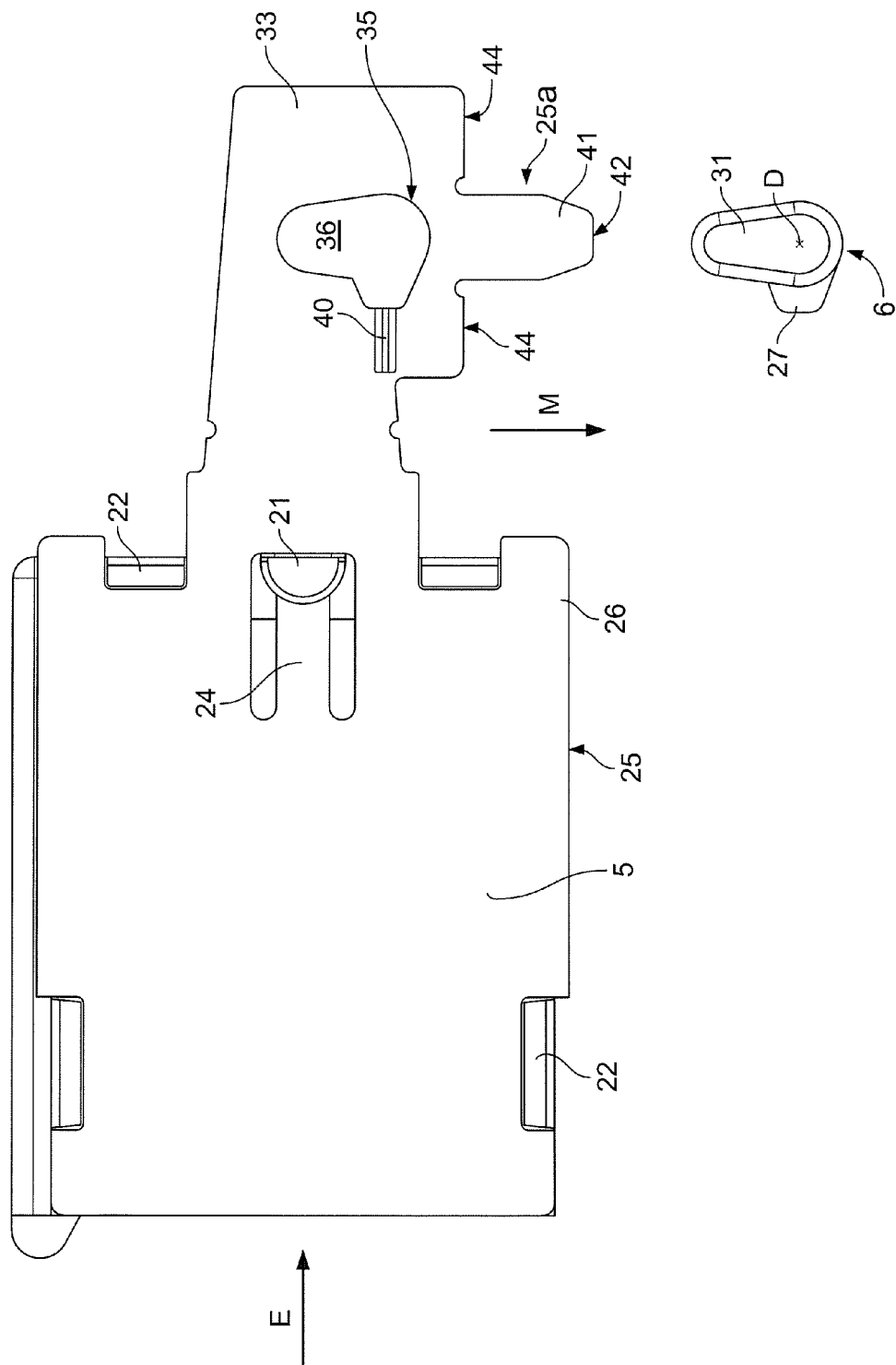
FIG. 3 is a side view of FIG. 2.

The outline of the recess 35 formed as a through-hole 36 substantially corresponds to the L-shaped insertion profile, viewed in the longitudinal direction L, of the orientation element 6, as can be seen in FIG. 3. Because the limbs formed by the orientation comb 27 and the securing projections 31 of the orientation element 6 have different lengths, it is only possible to insert the orientation element 6 through the through-hole 36 in a particular orientation along the longitudinal direction L of said orientation element in order to mount it.

Since, in the case of the electrical component 1 of the embodiment shown, two identical fastening means 4 are provided on the opposite side faces 18, the electrical component 1 in the embodiment shown consequently has two arms 33 each having a through-hole 36. The length of the orientation element 6 is calculated such that the orientation element 6 bridges the two arms 33 and can be held in the two through-openings 36, as can be seen for example in FIG. 4.

As long as either the securing projection 31 or oval-shaped cross-section comprising the orientation comb 27 of the orientation element 6 is located in one of the two through-openings 36 of the two arms 33, only a displacement of the orientation element 6 along its longitudinal direction L into the through-openings 36 is possible. A rotation of the orientation element 6 about its longitudinal axis, as a result of which the orientation element 6 is transferred from its mounting position, in which it can be installed on the retainer 34, in other words can be displaced into the through-openings 36, into the operating position, in which it is fixed or installed on the retainer 34, is only possible when the rotation portion 37 located between the orientation comb 27 and the securing element 31 is mounted in the through-opening 36. At the rotation portion 37 the orientation element 6 has a circular cross-section which substantially corresponds to the articulation at which the two limbs which are L-shaped in profile meet. The rotation portion 37 is the short region of the orientation element 6, which region is located between the orientation comb 27 and the securing wing 31.

When the orientation element 6 is rotated about its rotational axis D with rotation regions 37 positioned in the through-openings 36, the profile is rotated out of its congruence with the through-openings 36 in such a way that the securing projections 31 rest against the arm 33 and prevent a displacement of the orientation element 6 in or counter to the longitudinal direction L thereof. The same applies to the end portions 38 of the orientation comb 27, at which portions the orientation comb 27 transitions into the rotation portion 37. In this way the securing projections secure the orientation element 6 on the fastening means 4 against removal during the transfer from the mounting position into the operating position.

On the face which faces towards the orientation comb 27, the securing projection 31 is provided with a catch means 39, in the embodiment shown a catch lug 39, which, when the orientation element 6 is rotated through approximately 90°, latches into a corresponding counter catch 40 and locks the orientation element 6 against rotation on the fastening means 4.

The counter catch 40 is formed as a catch groove on the arm 33 and is directly connected to the region of the through-opening 36 of the arm 33, which region corresponds to the extension of the limb of the L-shaped through-hole 36, which limb is assigned to the orientation comb 27. The counter catch groove 40 is formed by a catch slot 40 which completely penetrates the face of the arm 33. This configuration has the advantage that the fastening means 4 comprising the arm 33 in the embodiment shown can be used independently of the side face 18 on which the fastening means 4 is arranged. Owing to the configuration as a slot, a counter catch 40 is formed on both sides of the arm 33.

When the orientation element 6 is rotated along its rotational axis, in other words when said orientation element is transferred from the mounting position into the operating position, the contact pins 3 can be orientated along the contact contour K by the orientation element 6. Configurations are possible in which the orientation element 6 is only brought into contact with the contact pins during the transfer, for example by rotating the orientation comb 27 towards the contact pins 3 arranged after the orientation element 6 in the mounting direction M. In this configuration the contact pins 3 do not yet rest against the orientation element 6 in the mounting position, but rather only in the operating position. However, it is also possible for the contact pins 3 already to touch the orientation element 6 in the mounting position and then to be orientated in the contact contour K when said orientation element is transferred into the operating position.

For mounting the electrical component 1 according to the invention on the carrier 14*a* or contact carrier 14, the fastening means 4 comprises mounting regions, as explained above. In the embodiment shown, mounting regions 26 are provided which extend on the side faces 18 and in the region of the lower face of the housing 2. In addition, the fastening means 4 comprises further mounting regions 25*a* which are formed on the arm 33. These further mounting regions 25*a* may be configured as mounting tongues 41 which project from the arm 33 towards the lower face 15 at the level of the through-opening 36. In the embodiment shown in FIG. 6, the fastening rails 26, the free ends 42 of the mounting tongues 41 which are arranged on the arm 33, and the contact portions 12 of the contact pins 4 are located substantially in a contact area K and can thus be associated with and connected to the contact surface 13 of the contact carrier 14 when the electrical component 1 is fitted on the contact carrier 13.

Alternatively, the housing body 2 of the component 1 can be mounted on a carrier 14*a* via the mounting rails 26, as shown in FIG. 5. This carrier 14*a* may, but need not necessarily be identical to the contact carrier 14, in other words a circuit board 14, for example.

This can best be seen in FIG. 5, which shows an electrical component 1 mounted on the carrier 14*a*, the contact portions 12 of which component are connected to the contact surface 13 of a contact carrier 14 in an electrically conductive and mechanical manner, the fastening means 4 which faces the viewer being omitted in the view of FIG. 5 in such a way that the course of the contact pins 3, which would otherwise be hidden by this fastening means 4, can be seen. FIG. 5 shows how the contact pins 3 rest in portions against the orientation comb 27 of the orientation element 6 with part of their spacer portion 11 and are orientated in the contact contour K by the orientation element 6. It also shows how the fastening regions 8 which face away from the contact contour K are fixed in the fastening grid 10 and project into the housing interior 17.

The contact surface 13, to which the contact portions 12 in the embodiment shown in FIG. 5 are connected, thus rests against the edge of the contact carrier 14, in such a way that for reasons of space it is less feasible to mount the housing body 2 on the contact carrier 14 in this embodiment. In the embodiment shown in FIG. 5, the electrical component 1 is connected to the contact carrier 14 only via the further mounting regions 25*a* which are formed on the arm 33. To this end, the mounting tongue 41 extends through a mounting opening 43 which is provided for this purpose and is formed in a circuit board 14, which forms the contact carrier in the embodiment shown. One fixing option consists in plastically deforming the free end of the mounting tongue 42, which end projects on the side of the contact carrier 14 opposite the contact surface 13, and thus fixing the mounting tongue 41 in the fastening opening 43. Alternatively or additionally, the lower edges 44 of the arm, which edges face in the mounting direction M and rest on the contact surface 13 of the contact carrier 14, can be connected mechanically, for example adhesively bonded or soldered, to the contact carrier 14.

Figure 5A:
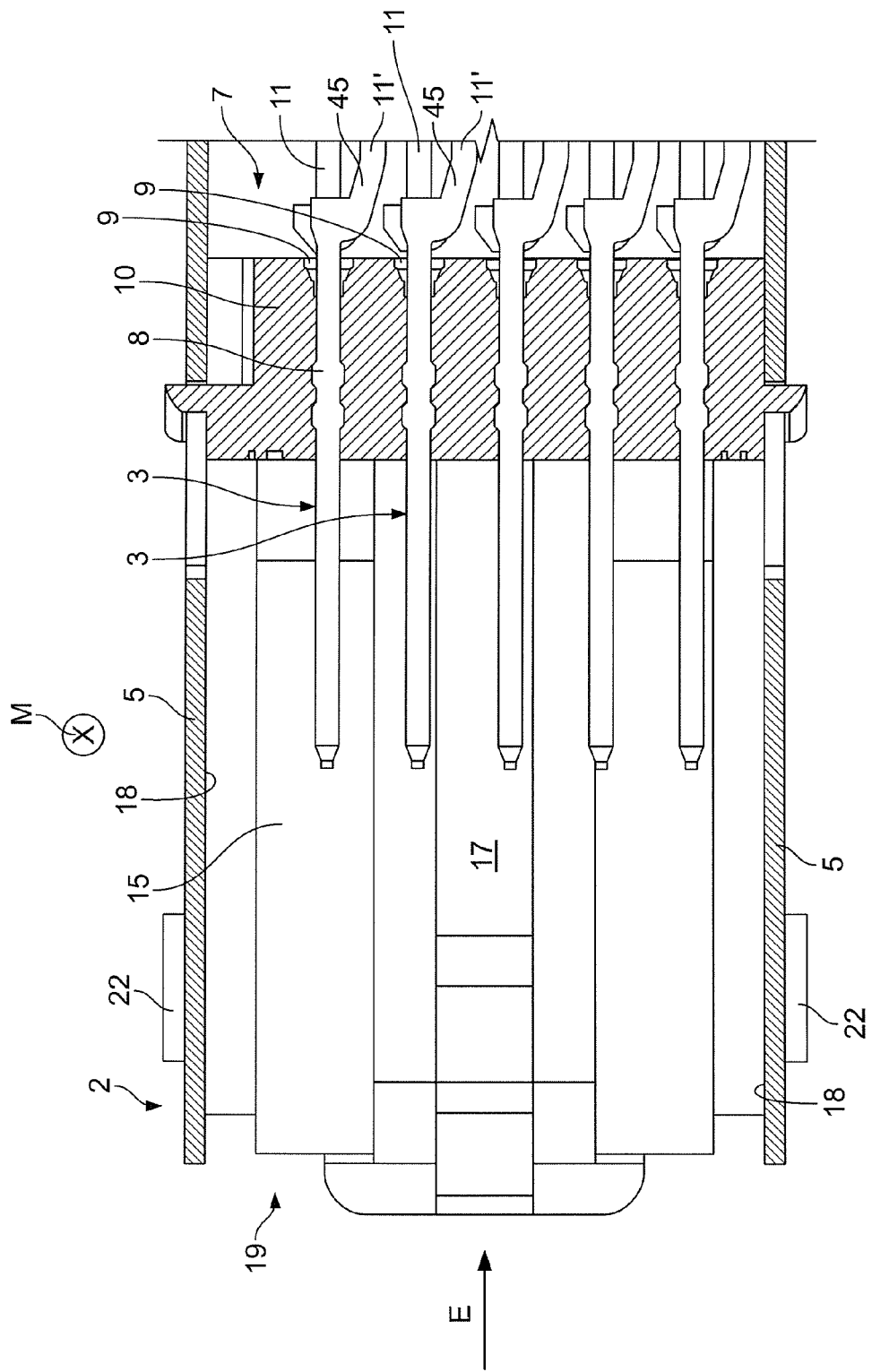
FIG. 5A is a sectional view of the component according to the invention, of the first embodiment of FIG. 5 along the line A-A.

FIG. 5A is a sectional view along the line A-A of the component 1 of FIG. 5. The detail merely shows the electrical component 1 from the connection side 19 up to the region of the contact side 7, in which region the fastening portion 8 transitions into the spacer portion 11 of the contact pins 3.

As can be seen in FIG. 5A, the free ends of the fastening portion 8 of the contact pins 3 project into the interior 17 of the housing body 2. FIG. 5A also shows that the fastening openings 9 in the fastening grid 10 are widened on the contact side 7 in order to facilitate insertion of the contact pins 3 into the fastening openings 9. Finally, FIG. 5A shows clearly that the spacer portions 11' of the upper row of contact pins 3 with respect to the contact area 14, which row can be seen in the sectional view of FIG. 5A, extends offset from the spacer portion 11 of the lower row of contact pins 3. While the spacer portion 11 and the fastening portion 8 of the lower row of contact pins 3 continue in a substantially straight line in the insertion direction E, the contact pins 3 of the upper row have a deflection portion 45 at the transition from the fastening portion 8 to the spacer portion 11. In the upper row, although the fastening portion 8 and the spacer portion 11' thus extend parallel to the insertion direction E, the spacer portion 11' is offset at right angles to the insertion direction E via the deflection portion 45 and, viewed in the mounting direction M, extends between two adjacent fastening portions 8. In this way the contact pins 3 of the two rows can be assigned to a single orientation element 6.

Further embodiments of the component 1 according to the invention will be described below with reference to FIGS. 6 and 7. Only the differences from the component of the first embodiment of FIG. 1 to 5 will be described. The same reference numerals as in the previous figures are used for parts having a function and/or construction similar or identical to parts of the previous embodiment.

Figure 7:
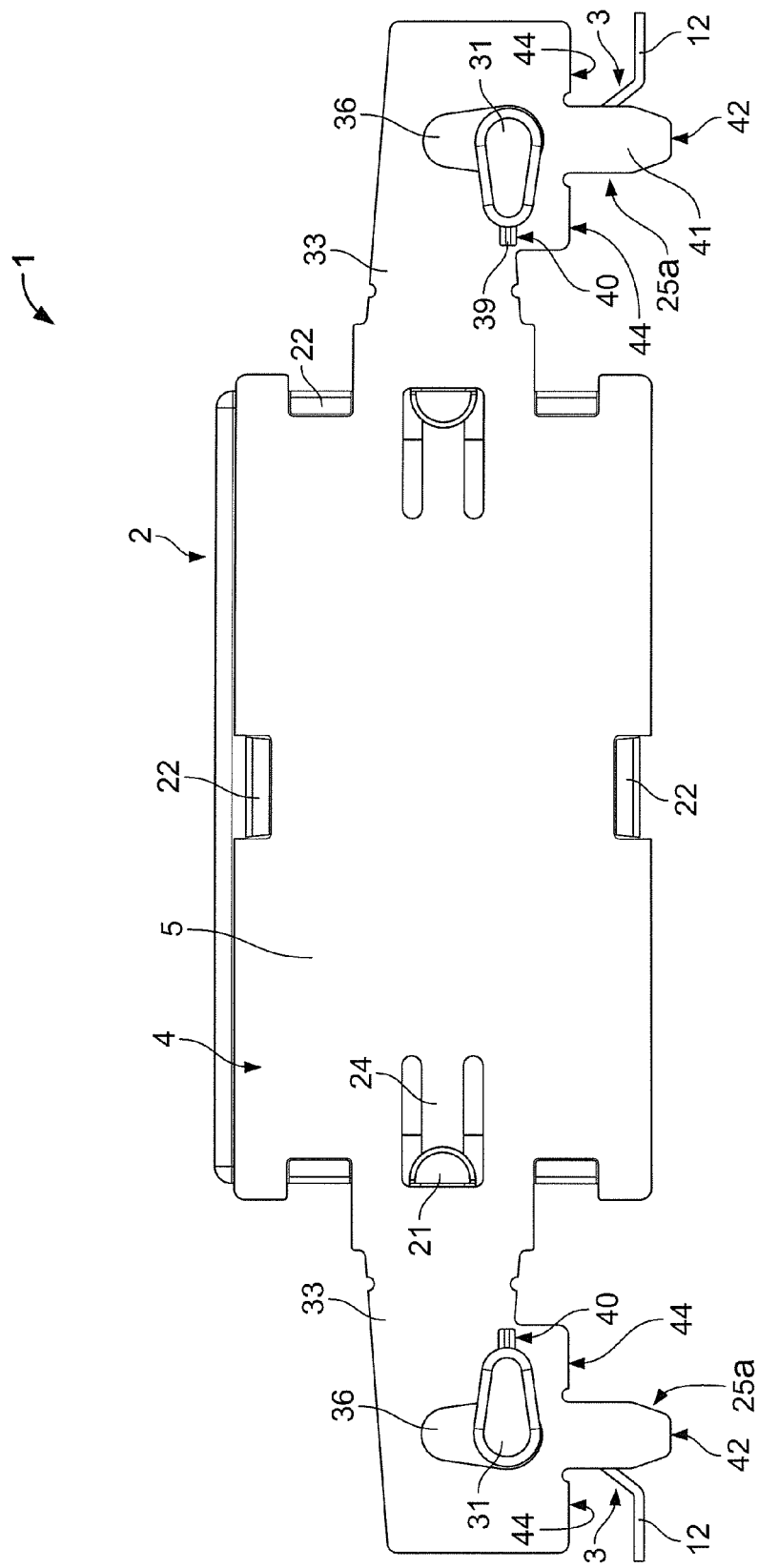
FIG. 7 is a side view of an electrical component according to the invention, according to a third embodiment.

In contrast to the component of FIG. 1 to 4, the components 1 shown in FIGS. 6 and 7 comprise more than one orientation element 6, specifically two orientation elements 6. In contrast to FIG. 5 of the previous embodiment, in FIG. 6 the electrical component 1 is mounted directly on the contact carrier 14 via the mounting regions 25, 25a of said component, the contact portions 12 of the contact pins being connected to the contact surface 13. As in FIG. 5, the fastening means 4 which faces the viewer has been omitted in FIG. 6 in order to show the course of the contact pins 3.

In the embodiment shown in FIG. 6, the arm 33 of the fastening means 4 is provided with two through-openings 36 arranged side by side in addition to counter catch slots 40, in such a way that two orientation elements 6 can be installed parallel and side by side on the same arm 33. In the second embodiment of FIG. 6, the mounting, installation and fixing of the orientation element 6 corresponds to that described above with regard to the first embodiment of the electrical component 1.

The component 1 of the embodiment shown in FIG. 6 also differs from the embodiment shown in FIG. 5 by a four-row arrangement of the contact pins 3. For this purpose, the fastening grid 10 is provided with four rows of fastening openings 9. The contact pins of the lower two rows with respect to the contact surface 13 are assigned to the orientation element 6 which is closer to the contact side 7 of the housing body 2. The upper two rows of contact pins 3 with respect to the contact surface 13 are assigned to the orientation element 6 which is more remote from the contact side 7, the assignment of two rows of contact pins 3 to one orientation element 6 in each case corresponding to the assignment shown in FIGS. 5 and 5A. In principle, a plurality of rows of contact pins 3 can thus be assigned to one or more orientation elements 6. In this case, the orientation elements 6 may be arranged either in succession in the insertion direction E or one above the other in the mounting direction M, it being possible for preferably two, but also a plurality of rows of contact pins 3 to be assigned to one orientation element 6 in each case.

FIG. 7 is a side view of a further embodiment of a component 1 according to the invention. FIG. 7 also shows the fastening means which faces the viewer. In contrast to the previous embodiments, the embodiment of FIG. 7 comprises a fastening means 4 having two arms 33, which project on opposite sides of the housing body 2 and are each formed, in accordance with the type of arm 33 of the first embodiment of FIG. 1 to 5, with a through-opening 36 for receiving one orientation element 6 per arm 33 in each case. The embodiment of FIG. 7 makes it possible for one orientation element or, if desired, a plurality of orientation elements 6 to be installed on two opposite sides of the component 1 in a constructionally simple manner using a fastening means 4.

The invention claimed is:

1. Electrical component, in particular for surface mounting, comprising a housing body, preferably configured as a housing block, comprising a plurality of contact pins which project from the housing body, at least in portions, and comprising at least one orientation element on which, at least in the operating position thereof, the contact pins rest orientated along a predetermined contact contour (K), at least in portions, wherein the at least one orientation element is installed with spacing from the housing body wherein at least one plate which is installed on the housing body forms at least one arm, the at least one arm comprises a retainer for installing the orientation element and the at least one orientation element is installed on the at least one arm which projects from the housing body, the at least one plate having at least one through opening therethough, the at least one through opening being profiled to receive the orientation element therethrough, the at least one orientation element has a plurality of teeth along an outer edge thereof defining valleys to arrange the contact pins, the at least one orientation element is configured such that it can be transferred from a mounting position, in which it can be installed on the retainer, by rotation into an operating position, in which it is fixed to the retainer.

2. Electrical component according to claim 1, wherein at least two arms are provided which are bridged by the orientation element.

3. Electrical component according to claim 1, wherein at least one fastening means for mounting the electrical component on a carrier, preferably a contact carrier, the at least one orientation element being installed on the at least one fastening means.

4. Electrical component according to claim 1, wherein the at least one fastening means forms the at least one plate.

5. Electrical component according to claim 1, wherein a preferably continuous recess in at least one arm forms the retainer.

6. Electrical component according to claim 5, wherein the at least one orientation element is configured such that it can be inserted into the recess and/or inserted through the recess.

7. Electrical component according to claim 1, comprising a securing means which secures the at least one orientation element against removal from the electrical component during the transfer from the mounting position into the operating position.

8. Electrical component according to claim 7, wherein a securing projection is formed as a securing means on the orientation element.

9. Electrical component according to claim 7, wherein a locking element for fixing the at least one orientation element in the operating position is arranged on the securing means.

10. Electrical component according to claim 1, wherein the orientation element includes an oval shaped orientation comb.

11. Electrical component according to claim 10, wherein the orientation element further comprises a securing projection, which projects in a direction away from a major axis of the oval shaped orientation comb.

12. Electrical component according to claim 11, wherein the at least one through opening is generally L-shaped having a first portion to receive the securing projection and a second portion to receive the oval shaped orientation comb.

13. Electrical component according to claim 12, wherein the at least one through opening is normal to the plate.

14. Electrical component according to claim 13, further comprising a second plate wherein the plates flank the orientation element.

15. Electrical component according to claim 14, wherein the orientation element includes a second securing projection and the second plate includes a second through opening, wherein the first and second securing projections are positioned outside of the first and second plates.

16. Electrical component according to claim 15, wherein the orientation element is rotatable about a longitudinal axis of the orientation element to a locked position.

17. Electrical component, in particular for surface mounting, comprising a housing body, preferably configured as a housing block, comprising a plurality of contact pins which project from the housing body, at least in portions, and comprising at least one orientation element on which, at least in the operating position thereof, the contact pins rest orientated along a predetermined contact contour (K), at least in portions, wherein the at least one orientation element is installed with spacing from the housing body wherein at least one plate which is installed on the housing body forms at least one arm, and the at least one orientation element is installed on the at least one arm which projects from the housing body, the at least one plate having at least one through opening therethough, the at least one through opening being profiled to receive the orientation element therethrough, wherein the orientation element includes an oval shaped orientation comb and wherein the orientation element further comprises a securing projection, which projects in a direction away from a major axis of the oval shaped orientation comb, the at least one through opening is generally L-shaped having a first portion to receive the securing projection and a second portion to receive the oval shaped orientation comb.

18. Electrical component according to claim 17, wherein at least two arms are provided which are bridged by the orientation element.

19. Electrical component according to claim 17, wherein at least one fastening means for mounting the electrical component on a carrier, preferably a contact carrier, the at least one orientation element being installed on the at least one fastening means.

20. Electrical component according to claim 17, wherein the at least one fastening means forms the at least one plate.

21. Electrical component according to claim 17, wherein at least one arm comprises a retainer for installing the orientation element.

22. Electrical component according to claim 21, wherein the at least one orientation element is configured such that it can be transferred from a mounting position, in which it can be installed on the retainer, into the operating position, in which it is fixed to the retainer.

23. Electrical component according to claim 17, wherein the at least one orientation element is configured such that it can be rotated from the mounting position into the operating position.

24. Electrical component according to claim 21, wherein a preferably continuous recess in at least one arm forms the retainer.

25. Electrical component according to claim 24, wherein the at least one orientation element is configured such that it can be inserted into the recess and/or inserted through the recess.

26. Electrical component according to claim 17, comprising a securing means which secures the at least one orientation element against removal from the electrical component during the transfer from the mounting position into the operating position.

27. Electrical component according to claim 26, wherein a securing projection is formed as a securing means on the orientation element.

28. Electrical component according to claim 26, wherein a locking element for fixing the at least one orientation element in the operating position is arranged on the securing means.

29. Electrical component according to claim 28, wherein the at least one through opening is normal to the plate.

30. Electrical component according to claim 29, further comprising a second plate wherein the plates flank the orientation element.

31. Electrical component according to claim 30, wherein the orientation element includes a second securing projection and the second plate includes a second through opening, wherein the first and second securing projections are positioned outside of the first and second plates.

32. Electrical component according to claim 31, wherein the orientation element is rotatable about a longitudinal axis of the orientation element to a locked position.

* * * * *